United States Patent [19]

Tung

[11] Patent Number: 4,963,873
[45] Date of Patent: Oct. 16, 1990

[54] DIGITAL/ANALOG CONVERTER WITH HIGH OUTPUT VOLTAGE STABILITY

[75] Inventor: Pham N. Tung, Paris, France
[73] Assignee: Thomson Hybrides et Microondes, Paris, France
[21] Appl. No.: 272,432
[22] Filed: Nov. 17, 1988
[30] Foreign Application Priority Data

Nov. 17, 1987 [FR] France .................... 87 15846

[51] Int. Cl.$^5$ ............................ H03M 1/80
[52] U.S. Cl. ........................ 341/153; 323/311
[58] Field of Search ............ 341/118, 136, 153, 119; 323/311, 312

[56] References Cited

U.S. PATENT DOCUMENTS 3,815,121  6/1974  Wilensky .................. 341/153

Primary Examiner—William M. Shoop, Jr.
Assistant Examiner—Marc S. Hoff
Attorney, Agent, or Firm—Oblon, Spivak, McClelland, Maier & Neustadt

[57] ABSTRACT

A digital/analog converter designed for very high frequencies is described. It has a first stage, which is a standard stage, in which several parallel-mounted controllable loads deliver currents in geometrical progression in a current/voltage converting transistor. Each controllable load has an input transistor, to the gate of which a bit is addressed as well as a diode and a saturable resistor. The second stage is a shifter formed by a transistor mounted as a follower source, in series with at least one diode and one pull-back transistor, the source of which is at a negative potential. The voltage at the drain of the converting transistor is applied to the gate of the shifter transistor, and the output voltage at the drain of the pull-back transistor is looped to the gate of the converting transistor.

5 Claims, 1 Drawing Sheet

DIGITAL/ANALOG CONVERTER WITH HIGH OUTPUT VOLTAGE STABILITY

BACKGROUND OF THE INVENTION

1. Field of the Invention

The present invention concerns a digital/analog converter which is more particularly designed to work with microwaves because of its simple structure which enables digital/analog conversion at very high throughput rates. The digital/analog converter according to the invention has an output stage which stabilizes the analog voltage delivered. Its embodiment is more particularly useful in fast integrated circuit form made by means of heterojunction transistors of Group III-V materials, such as GaAs and Al GaAs for example.

2. Description of the Prior Art

There are known methods for converting a binary number into an analog value by means of several programmed, parallel-mounted current sources Each source is controlled by one of the bits of the binary number. A current/voltage converting transistor adds up the currents of all the sources and converts the resultant current into an analog voltage.

The greater the number of bits of the input binary signal, the more precise is this voltage. However, it is subject to phenomena of instability, the sources of which can be found in all the components of the converter. This instability includes the instability of two voltage sources, +VDD and −VSS, between which the converter is supplied with power, the instability of the transistors of the programmed current sources and the instability of the current/voltage converter.

An object of the invention, therefore, is to propose a digital/analog converter, the output voltage of which is stabilized by a circuit which has a diagram resembling a BFL gate but which works differently, the output of this circuit being looped to the gate of the inverting transistor of the first stage, which forms the current/voltage converter. The analog voltage collected at the drain of this inverting transistor is addressed to the gate of a transistor mounted as a follower source in a second shifter gate which further has a shifter diode and a pull-back transistor. The output voltage of the digital/analog converter, taken at the common point between the shifter diodes and the pull-back transistor, is looped to the gate of the inverting transistor which is the current/voltage converter. Since it is an inverter, if the output voltage develops in one direction, the inverting transistor makes it develop in the reverse direction and stabilizes it.

SUMMARY OF THE INVENTION

More precisely, the invention concerns digital/analog converters with high output voltage stability comprising a first stage consisting of several loads controllable (i.e. capable of being modulated) in parallel which deliver currents in geometrical progression in a single transistor which is a current/voltage converter, each controllable load being formed by a transistor with its gate forming an input for the binary number, its drain powered by a positive voltage and its source connected, through a diode, to a saturable load which is itself connected to the drain of the current/voltage converting transistor, said digital/analog converter having a second stage which is an output voltage stabilizer, wherein the output voltage is applied to the gate of the current/voltage converting transistor, the source of which is at the ground.

BRIEF DESCRIPTION OF THE DRAWINGS

The invention will be better understood from the more detailed description which now follows and which is based on the appended figures, of which.

DESCRIPTION OF A PREFERRED EMBODIMENT

Figure 1:
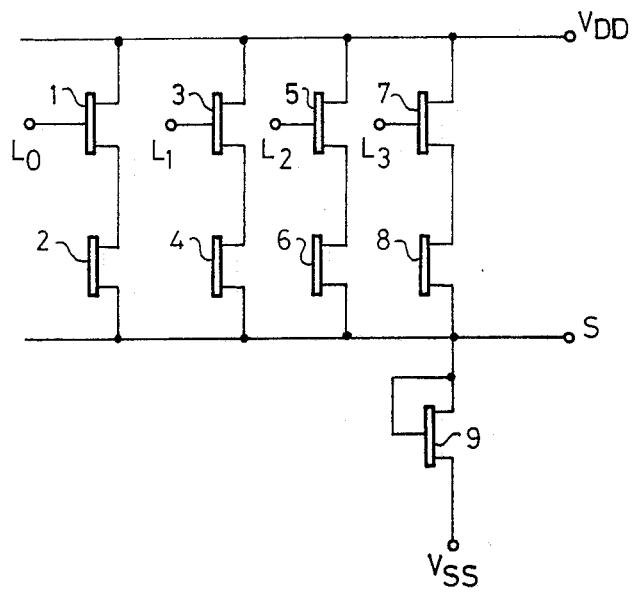
FIG. 1 shows an electrical diagram of a digital/analog converter according to the prior art.

FIG. 1 shows, by way of a reminder of prior art techniques, the electrical diagram of a digital/analog converter which works in the microwave field and is described in the French patent No. 85 19 126, filed by the Applicant on Dec. 24, 1985.

This digital/analog converter, which is herein represented in a four-bit model, has several parallel-mounted transistors 1, 3, 5 and 7. They therefore constitute only one stage, thus enabling faster conversion. These transistors, which are powered by their drains, have their sources connected to saturable resistors 2, 4, 6 and 8, one per transistor, the values of which are in geometrical progression, i.e. if the saturable resistor corresponding to the least significant bit lets through a current Io, the following saturable bits let through currents which are respectively $2I_o$, $4I_o$, $8I_o$ etc. The binary signals addressed in $L_0$, $L_1$, $L_2$, $L_3$ on the gates of the transistors make them deliver currents in geometrical progression through the resistors. Since all the saturable resistors from 2 to 8 are connected by their end which is not connected to a transistor source, the current delivered by this circuit is equal to the sum of all the currents delivered by the resistors in parallel.

The resultant current is converted into an analog voltage by means of the current/voltage converting transistor 9. It is mounted with the drain and gate connected together and to the common point of all the saturable resistances and its source is connected to the reference voltage $V_{SS}$. The output of the digital/analog converter is taken at the common point between the saturable resistors and the drain of the current/voltage converting transistor.

This type of converter works very fast because it has only one transistor stage, 1 to 7, between the input and the output, the saturable loads 2 to 8 being either transistors without gate metallizations or transistors having a recess in the semiconducting material between the two metallizations, namely the source and drain metallizations. However, the output voltage taken at the point S may undergo slight variations due to the variations or instabilities in the voltages $V_{DD}$ which power the drains of the input transistors, or instabilities in the voltage VSS connected to the source of the summator transistor 9 or, again, due to the instabilities inherent in the functioning of the transistors 1 to 7 as well as 9. Now the precision of the output analog voltage of a digital/analog converter is all the higher as the number of input bits is great, and it is regrettable that this voltage is subjected to variations due to the variations in the components of the circuit.

Figure 2:
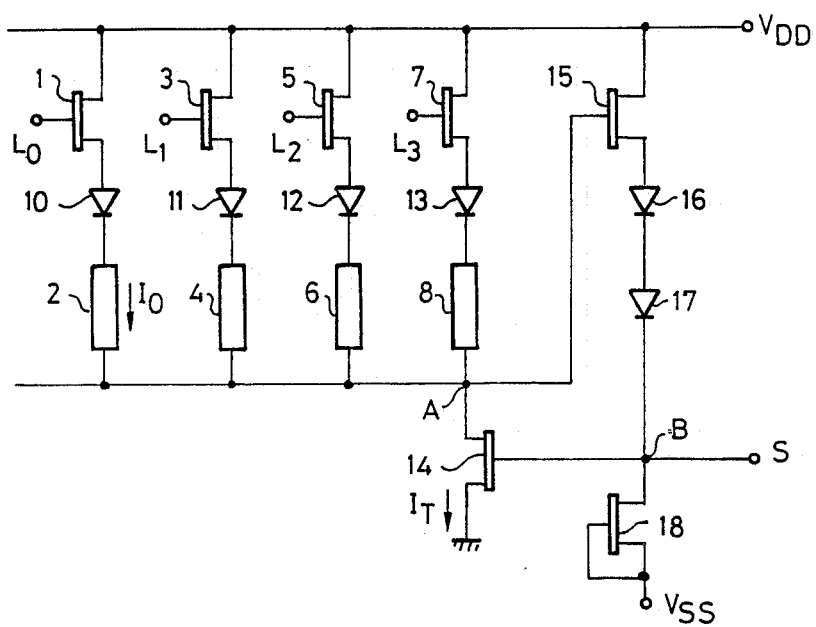
FIG. 2 shows an electrical diagram of a digital/analog converter according to the invention.

This therefore is what the invention proposes the stabilizing of the output voltage of a digital/analog converter based on the diagram of the digital/analog converter which has just been described. For this, an output stabilizing stage is added to it, along with a slight modification in the wiring of the current/voltage converting transistor, as shown in FIG. 2, which gives the diagram of the converter according to the invention.

The first stage of the digital/analog converter has a controllable load which powers the current/voltage converting transistor 14. The controllable load is comparable in all respects with the one described with reference to the prior art and it may have a diode 10 to 13 between each transistor and its saturable load. As a non-restrictive example, this load corresponds to a four-bit number with its input transistors 7 powered by the voltage $V_{DD}$ on their drain. Their source is connected to a diode 10 to 13 and delivers current to a saturable load, 2 to 8, which has been shown conventionally since there exist various types of saturable loads. The gates of the input transistors 1 to 7 form the inputs of the bits $L_0$ to $L_3$ which represent the binary number N.

$$N = L_0 + L_1 + L_2 + L_3.$$

The current/voltage converting transistor 14 has its source at the ground and its drain supplied by the controllable load. It has a negative threshold voltage $V_T$ and a constant transconductance $G_O$, which constitutes an important aspect of the invention.

The second digital/analog converter stage is a shifting stage formed by a transistor 15 with the same threshold voltage $V_T$ as that of the transistor 14. It is mounted as a follower source, its drain being supplied by $V_{DD}$ and its source is in series on one or more diodes 16, 17 as well with a pull-back load formed by a transistor 18, the source of which is connected to a negative voltage $V_{SS}$. The gate of the transistor 18 is connected to the source of this same transistor. The output S of the converter is taken at a point B which is common to the cathode of the last shifter diode 17 and to the drain of the pull-back transistor 18, but this point B is also connected to the gate of the current/voltage converting transistor 14 in such a way that the output current feeds back the transistor 14, which is the summator of the currents given by the first stage, at the point A.

The input transistors of the controllable loads 1 to 7 work like switches If $I_o$ designates the elementary current that goes through the first saturable load 2, $2I_O = I_1$ the current that goes through the second saturable load 4, $4I_O = I_2$ the current that goes through the third saturable load 6 and so on, and $I_T$ the total current that goes through the transistor 14, we can write:

$$I_T = L_0 I_0 + L_1 I_1 + L_2 I_2 + L_3 I_3 = NI_o$$

but the equation of the transistor 14 enables writing:

$$NI_o = G_0(V_S - V_T)$$

$V_S$ being the output voltage which is also the gate voltage of this transistor 14.

There is therefore a unique correspondence between the number N in its binary form and the output signal $V_S$ at the output of the digital/analog converter.

The role of the shifting stage is to stabilize the output voltage $V_S$. The transistor 14 and its load, which is herein the entire controllable load, constitutes the first stage of a BFL (Buffered FET Logic) type circuit, the second shifter circuit of which is formed by the transistor 15, at least one diode 16 and the pull-back transistor 18. The difference between the circuit shown in FIG. 2 and a BFL gate is that, in the BFL gate, there is no direct connection between the output and the gate of the input transistor 14. Consequently, if $V_S$, which is the voltage measured at the point B, increases then the current $I_T$ which flows through the transistor 14 increases since the voltage applied at its gate increases. The voltage at the point A, common to the drain of the transistor 14 and its load, is returned to a lower voltage according to the principle of logic inversion as the transistor 14 may be considered to be the inverter of a first stage of a BFL gate. Since the output voltage $V_S$ follows the voltage in A because the transistor 15 is a follower source, the output voltage $V_S$ is ultimately brought to a lower voltage. There is thus regulation and balance of the output voltage $V_S$.

In the same way, if the output voltage $V_S$ drops, the voltage at the drain at the point A increases and draws $V_S$ upwards: at equilibirum, the output voltage $V_S$ is stabilized. The table below gives a correspondence between the numbers N on the inputs $L_I$ of the input transistors of the controllable load and the output voltage $V_S$ taken at point B of the digital/analog converter. Let $V_S - V_T = V_0$, to simplify the writing:

| N | $S_0$ | $S_1$ | $S_2$ | $S_3$ | $V_S - V_T = V_0$ |
|---|---|---|---|---|---|
| 0 | 0 | 0 | 0 | 0 | 0 |
| 1 | 1 | 0 | 0 | 0 | $V_0$ |
| 2 | 0 | 1 | 0 | 0 | $2V_0$ |
| 3 | 1 | 1 | 0 | 0 | $3V_0$ |
| 4 | 0 | 0 | 1 | 0 | $4V_0$ |
| 5 | 1 | 0 | 1 | 0 | $5V_0$ |
| 6 | 0 | 1 | 1 | 0 | $6V_0$ |
| 7 | 1 | 1 | 1 | 0 | $7V_0$ |
| 8 | 0 | 0 | 0 | 1 | $8V_0$ |
| 9 | 1 | 0 | 0 | 1 | $9V_0$ |
| 10 | 0 | 1 | 0 | 1 | $10V_0$ |
| 11 | 1 | 1 | 0 | 1 | $11V_0$ |
| 12 | 0 | 0 | 1 | 1 | $12V_0$ |
| 13 | 1 | 0 | 1 | 1 | $13V_0$ |
| 14 | 0 | 1 | 1 | 1 | $14V_0$ |
| 15 | 1 | 1 | 1 | 1 | $15V_0$ |

But $G_O V_O = I_0$

Consequently, the choice of $V_0$ fixes $I_0$ and $G_0$. Reciprocally, it is possible to make a digital/analog converter by fixing the gain and the unit current $I_0$ of the constituent elements of the controllable load. For a threshold voltage $V_T = 2.5$ volts, the output voltage in an eight-bit digital/analog converter varies between $-2.5$ volts and $+50$ millivolts with 10 millivolt voltage intervals between each number expressed in analog form.

The digital/analog converter which has just been described is preferably made in integrated circuit form, using a fast material and with electron gas type transistors. It is used in microwave equipment to process information given in binary form, generally in telecommunications or for signals processing in radar, for example. It is specified in the following claims.

I claim:

1. A digital/analog converter with high output voltage stability, comprising a first stage, constituted by several loads controllable in parallel, which deliver currents in geometrical progression in a single current-/voltage converting transistor, each controllable load being constituted by a transistor having a gate forming an input for a bit of a binary number, a drain powered by a positive voltage and a source connected, through a diode, to a saturable load which is itself connected to the drain of the current/voltage converting transistor, said digital/analog converter having a second stage which is an output voltage stabilizer, wherein the output voltage is applied to the gate of the current/voltage converting transistor, the source of which is at ground potential.

2. A digital/analog converter according to claim 1, wherein the second stage is a shifter formed by a first transistor mounted as a follower source, with its gate connected to the drain of the current/voltage converting transistor, its drain powered by a positive voltage and its source connected, through at least one shifter diode, to a pull-back transistor, the gate and source of which are powered by a negative voltage, the output voltage of the second stage, taken at the drain of the pull-back transistor, being looped to the gate of the current/voltage converting transistor of the first stage.

3. A digital/analog converter according to claim 2, wherein the converting transistor has a negative threshold voltage and a constant transconductance and wherein the transistor set up as a follower source has the same negative threshold voltage, the input transistors having a positive threshold close to +0.1 V.

4. A digital/analog converter according to claim 2, wherein the number of shifter diodes in the shifting stage depends on the threshold voltage of the transistor set up as a follower source.

5. A digital/analog converter according to claim 2, wherein the choice of the transconductance of the converting transistor defines the sensitivity of the output voltage.

* * * * *